United States Patent
Yuan et al.

(10) Patent No.: US 10,154,204 B2
(45) Date of Patent: Dec. 11, 2018

(54) VIDEO COMPRESSIVE SENSING WITH SIDE INFORMATION

(71) Applicants: Xin Yuan, New Providence, NJ (US); Paul A. Wilford, Bernardville, NJ (US)

(72) Inventors: Xin Yuan, New Providence, NJ (US); Paul A. Wilford, Bernardville, NJ (US)

(73) Assignee: Nokia of America Corporation, Murray Hill, NJ (US)

( * ) Notice: Subject to any disclaimer, the term of this patent is extended or adjusted under 35 U.S.C. 154(b) by 0 days.

(21) Appl. No.: 15/454,972

(22) Filed: Mar. 9, 2017

(65) Prior Publication Data
US 2018/0262693 A1 Sep. 13, 2018

(51) Int. Cl.
| H04N 5/247 | (2006.01) |
| H04N 5/232 | (2006.01) |
| H04N 5/353 | (2011.01) |
| H04N 5/225 | (2006.01) |

(52) U.S. Cl.
CPC .......... *H04N 5/247* (2013.01); *H04N 5/2254* (2013.01); *H04N 5/2256* (2013.01); *H04N 5/23232* (2013.01); *H04N 5/23293* (2013.01); *H04N 5/353* (2013.01)

(58) Field of Classification Search
CPC .. H04N 5/247; H04N 5/23293; H04N 5/2256; H04N 5/353; H04N 5/23232; H04N 5/2254
USPC .................... 348/223.1–228.1, 362
See application file for complete search history.

(56) References Cited

U.S. PATENT DOCUMENTS

| 8,942,321 B2 | 1/2015 | Shental |
| 2007/0027656 A1 | 2/2007 | Baraniuk |
| 2009/0245591 A1* | 10/2009 | Rowe ................. G06K 9/00033 382/115 |
| 2014/0029824 A1 | 1/2014 | Shi |
| 2014/0231650 A1* | 8/2014 | Streuber .......... H01L 27/14625 250/349 |
| 2015/0029503 A1* | 1/2015 | McMackin ............... G01J 3/18 356/300 |
| 2016/0048950 A1 | 2/2016 | Baron |
| 2017/0126959 A1* | 5/2017 | Shabtay ............. H04N 5/23212 |

OTHER PUBLICATIONS

Xin Yuan, "Temporal Compressive Sensing Using Rotating Mask", Nokia Bell Labs, Oct. 3, 2016, 7 pages.
Xin Yuan, et al., "Adaptive Temporal Compressive Sensing For Video", Image Processing (ICIP), 20th IEEE International Conference, Sep. 15, 2013, 6 pages.
Xin Yuan, et al., "Low-Cost Compressive Sensing for Color Video and Depth", IEEE Conference on Computer Vision and Pattern Recognition, 2014, 8 pages.

(Continued)

*Primary Examiner* — Yogesh Aggarwal

(57) ABSTRACT

A time-dependent aperture is configured to modulate light during an integration time interval. A first detector is configured to capture a first image of a scene during the integration time interval using light received from the time-dependent aperture. A second detector is configured to capture a second image of the scene concurrently with the first detector capturing the first image. A processor is configured to reconstruct a plurality of images of the scene based on the first image and the second image.

20 Claims, 6 Drawing Sheets

(56) References Cited

OTHER PUBLICATIONS

D. Reddy, et al., "P2C2: Programmable Pixel Compressive Camera for High Speed Imaging", 24th IEEE Conference on Computer Vision and Pattern Recognition, Jun. 2011, 10 pages.

Patrick Llull, et al. "Coded aperture compressive temporal imaging", Optics Express, 2013, 20 pages.

Yasunobu Hitomi, et al. "Video from a single coded exposure photograph using a learned over-complete dictionary", International Conference on Computer Vision, 2011, 8 pages.

Liang Gao, et al., "Single-shot compressed ultrafast photography at one hundred billion frames per second", Nature, Dec. 4, 2014, 14 pages.

* cited by examiner

VIDEO COMPRESSIVE SENSING WITH SIDE INFORMATION

BACKGROUND

Compressive sensing techniques can be used to reduce the number of measurements of a scene that need to be captured to acquire the information to represent an image. In compressive sensing, M compressive measurements representing a compressed version of an N-pixel image are acquired and stored in place of the raw data for each of the N pixels of the N-pixel image (M is less than N). For example, a "lens-less" camera includes an array of shutters that are selectively opened or closed to allow light from a scene to reach a detector in the lens-less camera. Each of the shutters corresponds to a pixel of the acquired image. Sets of the shutters are opened together to define apertures that allow light to fall on the detector so that the detector is able to perform measurements of the intensity of the light received from the scene. Each measurement is performed by the detector for a different set of open shutters that define a different aperture. The complete image can be reconstructed from a number of measurements that is significantly less than the number of pixels in the image, thereby compressing the information required to represent the image. Compressive sensing therefore eliminates or reduces the need for compressing the image after acquisition as is done in conventional systems where the raw-data for each of the N pixels representing the image is acquired first and then compressed (e.g., into a JPEG compressed image) using conventional compression techniques.

SUMMARY OF EMBODIMENTS

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

In some embodiments, a method is provided for video compressive sensing with side information. The method includes capturing a first image of a scene using light that has been modulated by a time-dependent aperture during an integration time interval for the first image and capturing a second image of the scene concurrently with capturing the first image. The method also includes reconstructing a plurality of images of the scene based on the first image and the second image.

In some embodiments of the method, the time-dependent aperture includes at least one of a shifting mask, a rotating mask, a digital mirror device, or another spatial light modulation device.

In some embodiments of the method, capturing the first image includes capturing the first image using a first camera that includes the time-dependent aperture and capturing the second image includes capturing the second images in a second camera.

In some embodiments of the method, capturing the first image and the second image includes receiving light from the scene at a beam splitter via an objective lens that is shared by the first camera and the second camera and the beam splitter provides a first portion of the received light to the first camera and a second portion of the received light to the second camera.

In some embodiments of the method, capturing the first image includes capturing light received from the scene via a first objective lens in the first camera and capturing the second image includes capturing light received from the scene via a second objective lens in the second camera.

In some embodiments of the method, capturing the first image and the second image includes capturing the first image and the second image at the same resolution by collecting light over the same integration time interval.

In some embodiments of the method, capturing the first image includes capturing the first image at a first resolution and capturing the second image includes capturing the second image at a second resolution that is different than the first resolution.

In some embodiments of the method, capturing the first image includes capturing light received over a first integration time interval and capturing the second image includes capturing light received over a second integration time interval that differs from, and overlaps with, the first integration time interval.

In some embodiments of the method, capturing the first image includes capturing a red-green-blue (RGB) image and capturing the second image includes capturing at least one of an RGB image, a grayscale image, an infra-red image, or an image acquired in another bandwidth.

In some embodiments, an apparatus is provided for video compressive sensing with side information. The apparatus includes a time-dependent aperture configured to modulate light during an integration time interval. The apparatus also includes a first detector configured to capture a first image of a scene during the integration time interval using the modulated light received from the time-dependent aperture and a second detector configured to capture a second image of the scene concurrently with the first detector capturing the first image. The apparatus further includes a processor configured to reconstruct a plurality of images of the scene based on the first image and the second image.

In some embodiments of the apparatus, the time-dependent aperture includes at least one of a shifting mask, a rotating mask, a digital mirror device, or another spatial light modulation device.

In some embodiments, the apparatus includes an objective lens configured to receive light from the scene and a beam splitter configured to receive light from the objective lens and provide a first portion of the light to the time-dependent aperture and a second portion of the light to the second detector.

In some embodiments, the apparatus includes a first camera comprising the time-dependent aperture and the first detector and a second camera that does not include any time-dependent apertures to modulate light received from the scene.

In some embodiments of the apparatus, the first camera includes a first objective lens configured to receive light from the scene and to provide light to the time-dependent aperture and the second camera includes a second objective lens configured to receive light from the scene and to provide light to the second detector.

In some embodiments of the apparatus, the first detector and the second detector are configured to capture the first image and the second image at the same resolution by collecting light over the same integration time interval.

In some embodiments of the apparatus, the first detector is configured to capture the first image at a first resolution and the second detector is configured to capture the second image at a second resolution that is different than the first resolution.

In some embodiments of the apparatus, the first detector is configured to capture light received over a first integration time interval and the second detector is configured to capture light received over a second integration time interval that differs from, and overlaps with, the first integration time interval.

In some embodiments of the apparatus, the first detector is configured to capture an RGB image and the second detector is configured to capture at least one of an RGB image, a grayscale image, an infrared image, or an image acquired at another bandwidth.

In some embodiments, an apparatus is provided for video compressive sensing with side information. The apparatus includes a memory element configured to store information representative of a first image captured by a first detector using light from a scene that has been modulated by a time-dependent aperture during an integration time interval for the first image and a second image of the scene captured by a second detector concurrently with the first detector capturing the first image. The apparatus also includes a processor configured to reconstruct a plurality of images of the scene based on the first image and the second image.

In some embodiments, the apparatus includes a time-dependent aperture configured to generate a plurality of different masks to modulate light during the integration time interval and the first detector is configured to capture the first image during the integration time interval using the modulated light.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
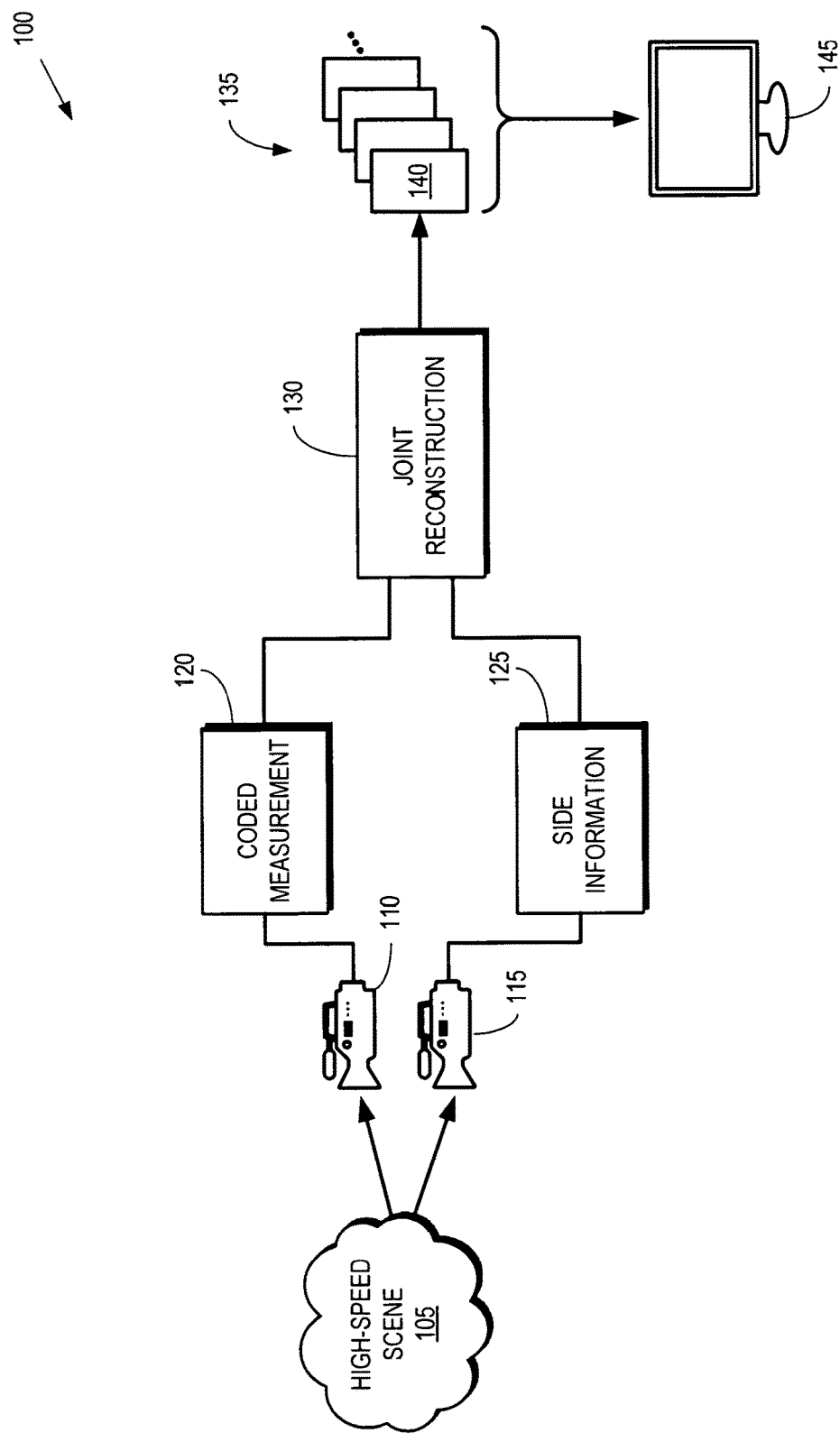
FIG. 1 is a block diagram of an image acquisition and display system that implements joint reconstruction of video compressive sensing measurements using side information according to some embodiments.

Compressive sensing is also used to capture high-speed video at a low frame rate using temporal compression. In video compressive sensing, a camera generates an image for each frame of the video by integrating the intensity of received light over an integration period such as 33 milliseconds (ms) if the normal frame rate for the camera is 30 frames per second (fps). The light received by the camera passes through a coded aperture before falling on the detector in the camera. The coded aperture represents a time-dependent mask that blocks portions of the incident light and allows other portions of the incident light to fall on subsets of the pixels in the detector. The time-dependent mask changes at a frame rate that is higher than the frame rate of the camera and the different masks correspond to different high-speed frames. For example, the coded aperture can generate $N_F$ different masks during a 33 ms integration period so that the high-speed frame rate is $30 \times N_F$. The image captured by the detector for each normal frame is equal to a sum of the $N_F$ images generated by the $N_F$ masks superimposed on the high-speed video frames over the 33 ms integration period. The $N_F$ high-speed video frames are therefore compressed into a single normal frame, which is a linear combination of the underlying high-speed frames that are modulated by the time-dependent mask, e.g., at a higher frequency than 30 FPS. The $N_F$ high-speed video frames can be reconstructed from the single normal frame using conventional video compressive sensing inversion algorithms. However, reconstructing spatial and temporal information from a single measurement can compromise the quality of the reconstructed images if an incorrect regularization is used for the reconstruction.

The quality of the reconstructed images can be improved, while reducing dependency on the regularization used for the reconstruction, by capturing a first image of a scene using light passing through a time-dependent aperture that modulates light during an integration time interval for the first image, capturing a second image of the scene, and reconstructing a plurality of images of the scene based on the first image and the second image. In some embodiments, the time-dependent aperture generates $N_F$ masks during the integration time interval and $N_F$ images of the scene during the integration time interval are reconstructed based on the first image and the second image. Thus, the modulation frequency of the time-dependent aperture is higher than the image acquisition frequency, e.g., as determined by the integration time interval. The time-dependent aperture can be implemented using a shifting mask, a rotating mask, a digital mirror device, or other spatial light modulation device. The first image is captured by a first camera that includes a time-dependent aperture in the optical path and the second image is captured by a second camera. Some embodiments of the second camera do not include a time-dependent aperture in the optical path, but other embodiments of the second camera include a time-dependent aperture that modulates light at the same frequency as the time-dependent aperture in the first camera or at a different frequency than the time-dependent aperture in the first camera. In some embodiments, the first camera and the second camera share an objective lens and a beam splitter provides portions of the light from the scene to the first camera and the second camera. In other embodiments, the first camera and the second camera are implemented as separate cameras that independently receive light from the scene. The first camera and the second camera can include detectors having the same resolution and can generate the first and second images by collecting light over the same integration time interval. Alternatively, the second camera can include a detector having a lower resolution than the detector in the first camera, the first and second cameras can use different integration time intervals, or the second camera can provide an RGB image or a grayscale image of the scene.

FIG. 1 is a block diagram of an image acquisition and display system 100 that implements joint reconstruction of video compressive sensing measurements using side information according to some embodiments. In the illustrated embodiment, light from a high-speed scene 105 is received by cameras 110, 115 that capture images (also referred to herein as frames) of a video representation of the high-speed scene. As used herein, the term "high-speed scene" refers to any scene that is represented by video at a temporal resolution that is higher than a native temporal resolution of the cameras 110, 115. For example, the cameras 110, 115 can include detectors that integrate received light over an integration time interval (or exposure time) of 33 ms to produce images at a frame rate of 30 FPS. Using embodiments of the video compressive sensing techniques described herein, the high-speed scene can be represented by a video stream of images at a frame rate that is larger than the native frame rate of 30 FPS.

The camera 110 generates a set of coded measurements that is captured from light received from the high-speed scene 105. Each coded measurement is an image that is captured over an integration time interval using light that passes through a time-dependent coded aperture before falling on a detector in the camera 110. The time-dependent coded aperture generates a plurality of different masks that block different portions of the received light during each integration time interval. For example, the time-dependent coded aperture can generate $N_F$ masks during each 33 ms integration period. The portion of the image that is captured while each mask is being applied by the time-dependent coded aperture represents one high-speed frame. Thus, the high-speed frame rate that can be achieved in a video stream produced by the image acquisition and display system 100 is $30 \times N_F$ FPS. The image captured by the camera 110 during the integration time interval is equal to a sum of the $N_F$ images generated by the $N_F$ masks superimposed on the high-speed video frames over the 33 ms integration period. The images captured by the camera 110 are stored as coded measurements in a memory element 120.

The camera 115 generates an image of the high-speed scene 105 using light that does not pass through a time-dependent coded aperture. Some embodiments of the camera 115 implement the same optical system and detectors as the camera 110. The camera 115 may or may not implement a time-dependent coded aperture. If the camera 115 implements a time-dependent coded aperture, the time-dependent coded aperture can modulate light at the same frequency as the time-dependent coded aperture implemented in the first camera 110 or can modulate light at a different frequency than the time-dependent coded aperture implemented in the first camera 110. The camera 115 can therefore capture images of the high-speed scene 105 over the same integration time intervals as the camera 110. For example, the camera 115 can capture images during the same 33 ms integration time intervals of the camera 110. Other embodiments of the camera 115 implement a different optical system or detectors than the camera 110. For example, the camera 115 can acquire images at a lower resolution than the camera 110. For another example, the camera 115 can acquire images at a higher temporal resolution (e.g., a higher frame rate) or a lower temporal resolution (e.g. a lower frame rate) than the camera 110. For yet another example, the camera 110 can acquire RGB images of the high-speed scene 105 and the camera 115 can acquire one or more frequency bands such as RGB images, grayscale images, infrared images, or images of the high-speed scene 105 in other bandwidths. The images acquired by the camera 115 are referred to herein as "side information," which is stored in a memory element 125. In some embodiments, the memory element 125 and the memory element 125 are implemented using the same device, such as a random access memory (RAM).

The image acquisition and display system 100 also includes a processor 130 that is configured to perform joint reconstruction of the high-speed video stream based on the coded measurements stored in the memory element 120 and the side information stored in the memory element 125. The high-speed video scene 105 is represented as f(x,y,t) and the time-dependent coded aperture that is superimposed on the scene by the camera 110 to form the coded measurements 120 is represented as h(x,y,t). The coded measurements 120 and the side information 125 measured by the camera 115 are represented as $g^{(1)}(x,y)$ and $g^{(2)}(x,y)$, respectively, where:

$$g^{(1)}(x,y) = \int f(x,y,t)h(x,y,t)dt$$

$$g^{(2)}(x,y) = \int f(x,y,t)dt$$

The integration is taken over the integration time intervals of the detectors in the cameras 110, 115, which are assumed to be the same in the present example but do not need to be the same in all embodiments, as discussed herein.

Considering the discretized scene $F \in \mathbb{R}^{N_x \times N_y \times N_t}$ where $N_t$ high-speed frames are considered in one integration time interval. After rectification and calibration (if necessary), the cameras 110, 115 produce two measurements ($G^{(1)} \in \mathbb{R}^{N_x \times N_y}$ and $G^{(2)} \in \mathbb{R}^{N_x \times N_y}$) based on the discretized scene:

$$G^{(1)} = \sum_{t=1}^{N_t} F_t \odot H_t + W^{(1)}$$

$$G^{(2)} = \sum_{t=1}^{N_t} F_t + W^{(2)}$$

where $F_t \in \mathbb{R}^{N_x \times N_y}$ denotes the t-th high-speed frame within the current integration time interval, $H_t \in \mathbb{R}^{N_x \times N_y}$ denotes the mask imposed on the light received from the high-speed scene 105 by the time-dependent coded aperture in the camera 110, and $W^{(1)}$ and $W^{(2)}$ denote the measurement noise for measurements performed by the cameras 110, 115.

For each pixel (i,j) in the captured images, where $i = 1, \ldots, N_x$ and $j = 1, \ldots, N_y$, the measurements can be written as:

$$g_{i,j}^{(1)} = \sum_{t=1}^{N_t} f_{i,j,t} h_{i,j,t} + w_{i,j}^{(1)}$$

$$g_{i,j}^{(2)} = \sum_{t=1}^{N_t} f_{i,j,t} + w_{i,j}^{(2)}$$

The vectorized forms of the above pixel measurements can be written as:

$$g^{(1)} = H^{(1)} f + w^{(1)}$$
$$g^{(2)} = H^{(2)} f + w^{(2)}$$

where $$f = \begin{bmatrix} f_1 \\ f_2 \\ \vdots \\ f_{N_t} \end{bmatrix}$$

$$H^{(1)} = [\text{Diag}(h_1), \text{Diag}(h_2), \ldots, \text{Diag}(h_{N_t})]$$
$$H^{(2)} = [I, I, \ldots, I]$$

where $\text{Diag}(h_k)$ denotes a diagonal matrix is diagonal elements are composed of the vector $h_k$ and I is the identity matrix.

The measurements captured by the cameras 110, 115 can then be concatenated to form a measurement model:

$$g = Hf + n$$
$$g = \begin{bmatrix} g^{(1)} \\ g^{(2)} \end{bmatrix}$$
$$H = \begin{bmatrix} H^{(1)} \\ \alpha H^{(2)} \end{bmatrix}$$

where α is a constant that is used to scale the measurements to the same illumination level for the cameras 110, 115.

The processor 130 performs joint reconstruction of the high-speed images using the coded measurements 120 and the side information 125 by solving a reconstruction problem that can be formulated as:

$$\hat{f} = \underset{f}{\text{argmin}} \| g - Hf \|_2^2 + \tau R(f)$$

where R(f) denotes the regularizer, which can be used to impose sparsity on the signal on the basis of wavelet transforms, a discrete cosine transformation, or a TV operator. In some embodiments, dictionary learning, GMM based algorithms or any other video compressive sensing algorithms can be used to perform reconstruction of the high-speed images.

In some embodiments, the processor 130 provides a set 135 of high-speed images 140 (only one indicated by a reference numeral in the interest of clarity) for presentation on a display 145. The number of high-speed images 140 in the set 135 is larger than the number of images in the coded measurements 120 by a factor that is equal to the number of different masks generated by the time-dependent coded aperture during an integration time interval of the camera 110. For example, if the camera 110 generates frames at 30 FPS using an integration time interval of 33 ms and the time-dependent coded aperture generates $N_t$ different masks during the integration time interval, the number of high-speed images 140 is larger than the number of coded measurements by a factor of $N_t$. Consequently, the frame rate of the high-speed video is 30×$N_t$ FPS.

Figure 2:
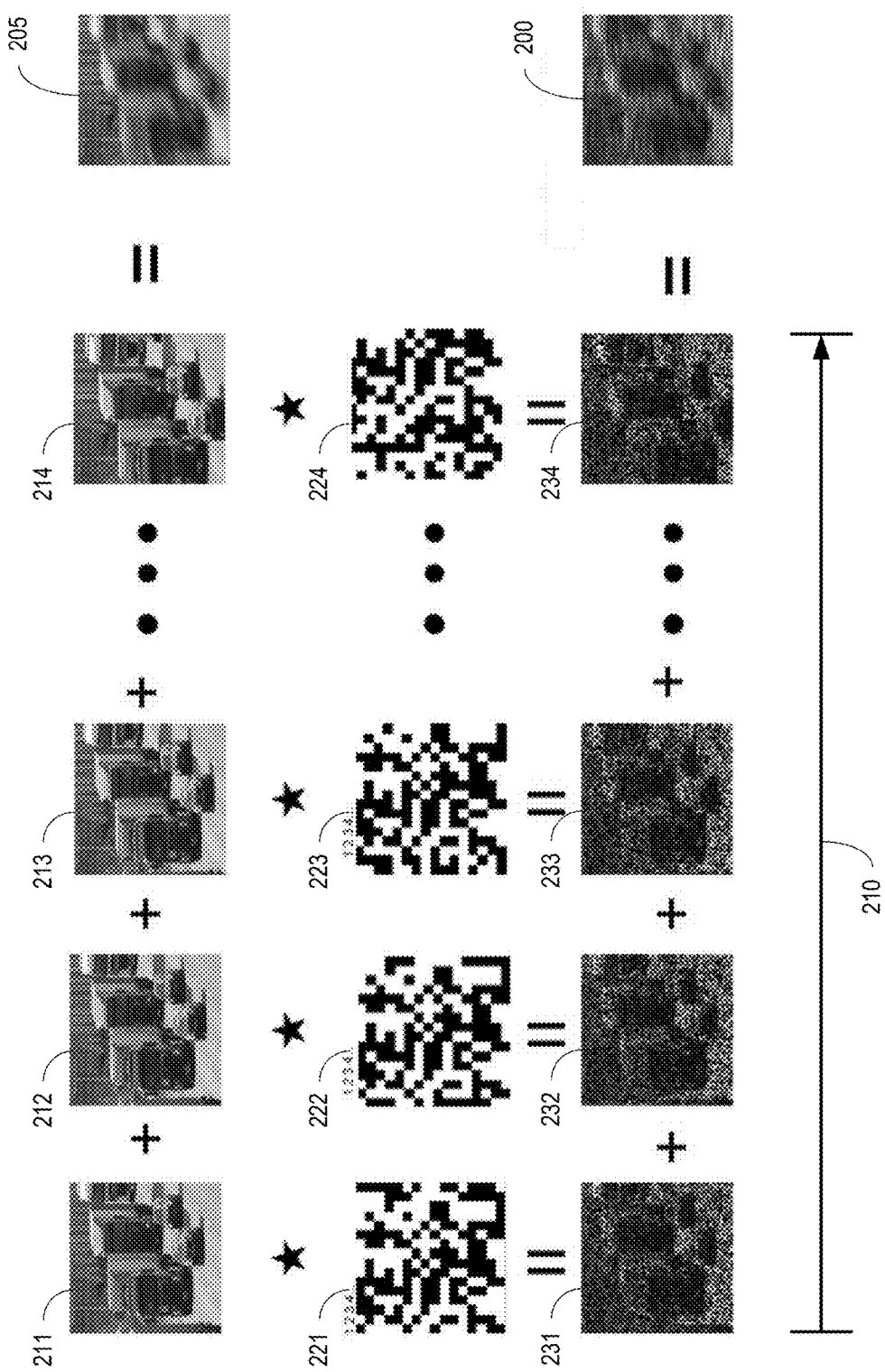
FIG. 2 illustrates a coded measurement collected by a first detector using a time-dependent coded aperture and side information collected by a second detector according to some embodiments.

FIG. 2 illustrates a coded measurement 200 collected by a first detector using a time-dependent coded aperture and side information 205 collected by a second detector according to some embodiments. The coded measurement 200 is captured by a first detector that is implemented in some embodiments of the camera 110 and stored in some embodiments of the memory element 120 shown in FIG. 1. The side information 205 is captured by a second detector that is implemented in some embodiments of the (second) camera 115 and stored in some embodiments of the memory element 125 shown in FIG. 1. The coded measurement 200 and the side information 205 are collected during an integration time interval 210. However, as discussed herein, in some embodiments the coded measurement and the side information are captured by the first and second detectors in concurrent, but possibly different, integration time intervals.

The scene viewed by the first and second detectors during subintervals of the integration time interval 210 corresponding to high-speed frames is represented by the images 211, 212, 213, 214, which are collectively referred to herein as "the images 211-214." The second detector captures the (unmasked, uncoded) images 211-214 during the integration time interval 210. The side information 205 captured by the second detector is therefore a linear combination of the images 211-214. A time-dependent coded aperture applies different masks 221, 222, 223, 224 (collectively referred to herein as "the masks 221-224") to the images 211-214 to produce the coded measurements 231, 232, 233, 234, which are collectively referred to herein as "the coded measurements 231-234." For example, the time-dependent coded aperture can form the coded measurements 231-234 as a Hadamard product of the images 211-214 and the masks 221-224. The second detector forms the coded measurement 200 by integrating the coded measurements 231-234 over the integration time interval 210. The coded measurement 200 is therefore a linear combination of the coded measurements 231-234.

Figure 3:
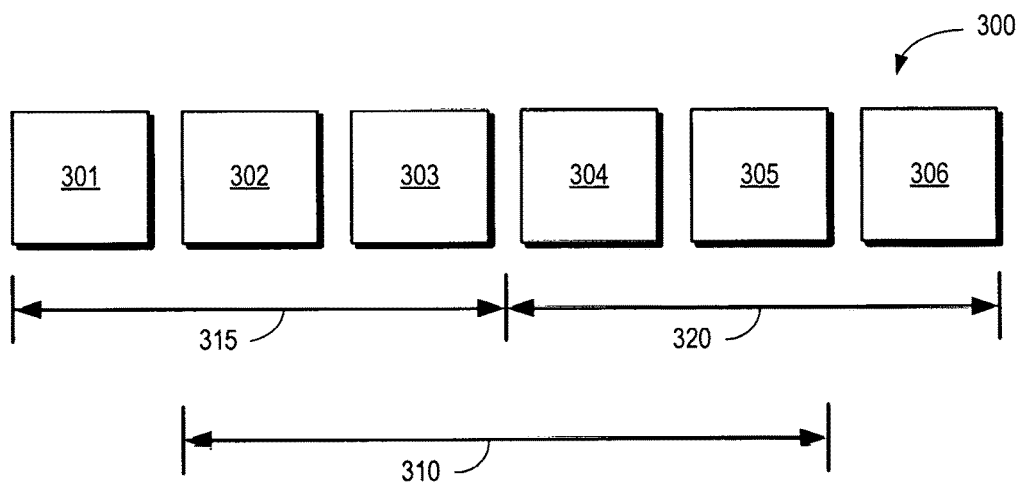
FIG. 3 is a block diagram of a high-speed video stream that is captured by a first detector over a first integration time interval and a second detector over a second (shorter) integration time interval according to some embodiments.

FIG. 3 is a block diagram of a high-speed video stream 300 that is captured by a first detector over a first integration time interval and a second detector over a second (shorter) integration time interval according to some embodiments. The high-speed video stream 300 is captured by detectors implemented in some embodiments of the cameras 110, 115 shown in FIG. 1. The first detector applies a time-dependent coded aperture to frames 301, 302, 303, 304, 305, 306 (collectively referred to herein as "the frames 301-306") to capture coded measurements over an integration time interval 310. The coded measurement captured by the first detector is therefore a linear combination of the frames 302-305. The second detector captures the frames 301-306 directly without applying any time-dependent coded apertures to the frames 301-306. The second detector captures the frames 301-306 over the integration time intervals 315, 320, which are shorter than, but overlap with, the integration time interval 310. The side information captured by the second detector is therefore formed based on a linear combination of the frames 301-303 and a linear combination of the frames 304-306.

Figure 4:
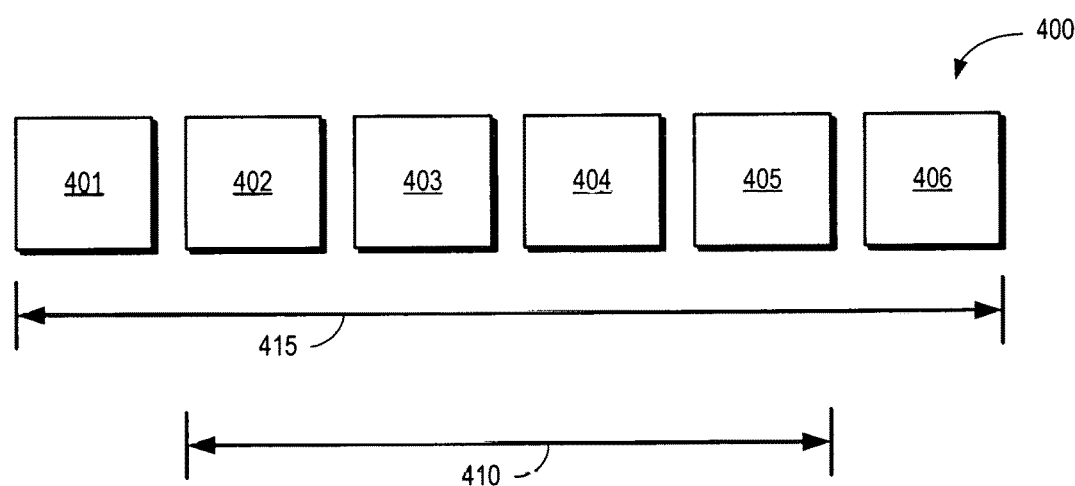
FIG. 4 is a block diagram of a high-speed video stream that is captured by a first detector over a first integration time interval and a second detector over a second (longer) integration time interval according to some embodiments.

FIG. 4 is a block diagram of a high-speed video stream 400 that is captured by a first detector over a first integration time interval and a second detector over a second (longer) integration time interval according to some embodiments. The high-speed video stream 400 is captured by detectors implemented in some embodiments of the cameras 110, 115 shown in FIG. 1. The first detector applies a time-dependent coded aperture to frames 401, 402, 403, 404, 405, 406 (collectively referred to herein as "the frames 401-406") to capture coded measurements over an integration time interval 410. The coded measurement captured by the first detector is therefore a linear combination of the frames 402-405. The second detector captures the frames 401-406 directly without applying any time-dependent coded apertures to the frames 401-406. The second detector captures the frames 401-406 over the integration time interval 415, which is longer than, but overlaps with, the integration time interval 410. The side information captured by the second detector is therefore formed based on a linear combination of the frames 301-306.

Figure 5:
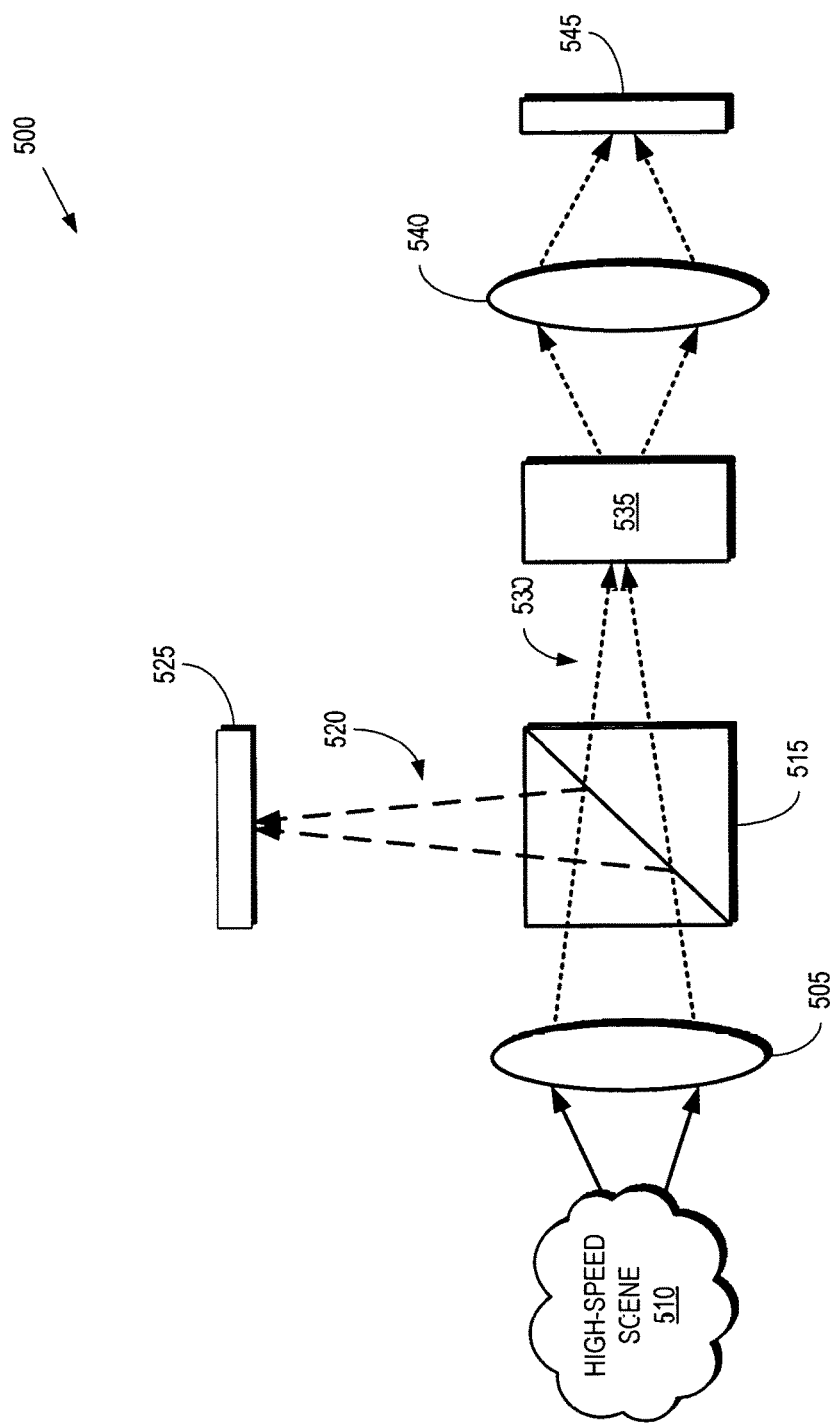
FIG. 5 is a block diagram of an image acquisition system that performs video compressive sensing and acquires side information using a shared objective lens according to some embodiments.

FIG. 5 is a block diagram of an image acquisition system 500 that performs video compressive sensing and acquires side information using a shared objective lens 505 according to some embodiments. The image acquisition system 500 is used to implement some embodiments of the cameras 110, 115 shown in FIG. 1. Light from a high-speed scene 510 is collected by the shared objective lens 505 and provided to a beam splitter 515. A first portion 520 of the light provided by the shared objective lens 505 is directed to a first detector 525, which captures images of the high-speed scene 510 over an integration time interval. The images captured by the first detector 525 are used as side information.

A second portion 530 of the light provided by the shared objective lens 505 is directed to a time-dependent coded aperture 535, which can be implemented as a shifting mask, a rotating mask, a digital mirror device, or other element that is able to modulate the light at a modulation frequency, e.g. by selectively blocking, transmitting, or reflecting portions of the light received from the beam splitter 515. Light that has been modulated by the time-dependent coded aperture 535 is provided to a secondary lens 540, which focuses the light onto a second detector 545. The second detector 545 captures coded images of the high-speed scene 510 over an integration time interval. The images captured by the second detector 545 are coded measurements used in conjunction with the side information generated by the first detector 525 to generate high-speed video frames.

The images can be captured by the first detector 525 and the second detector 545 over the same integration time interval and at the same resolution. However, in some embodiments, the characteristics of the first detector 525 differ from the characteristics of the second detector 545. For example, the first detector 525 can have a lower resolution than the second detector 545, the first detector 525 and the second detector 545 can use different integration time intervals, or the first detector 525 can provide an RGB image, a grayscale image, an infrared image, or an image of the high-speed scene 510 acquired in other bandwidths.

Figure 6:
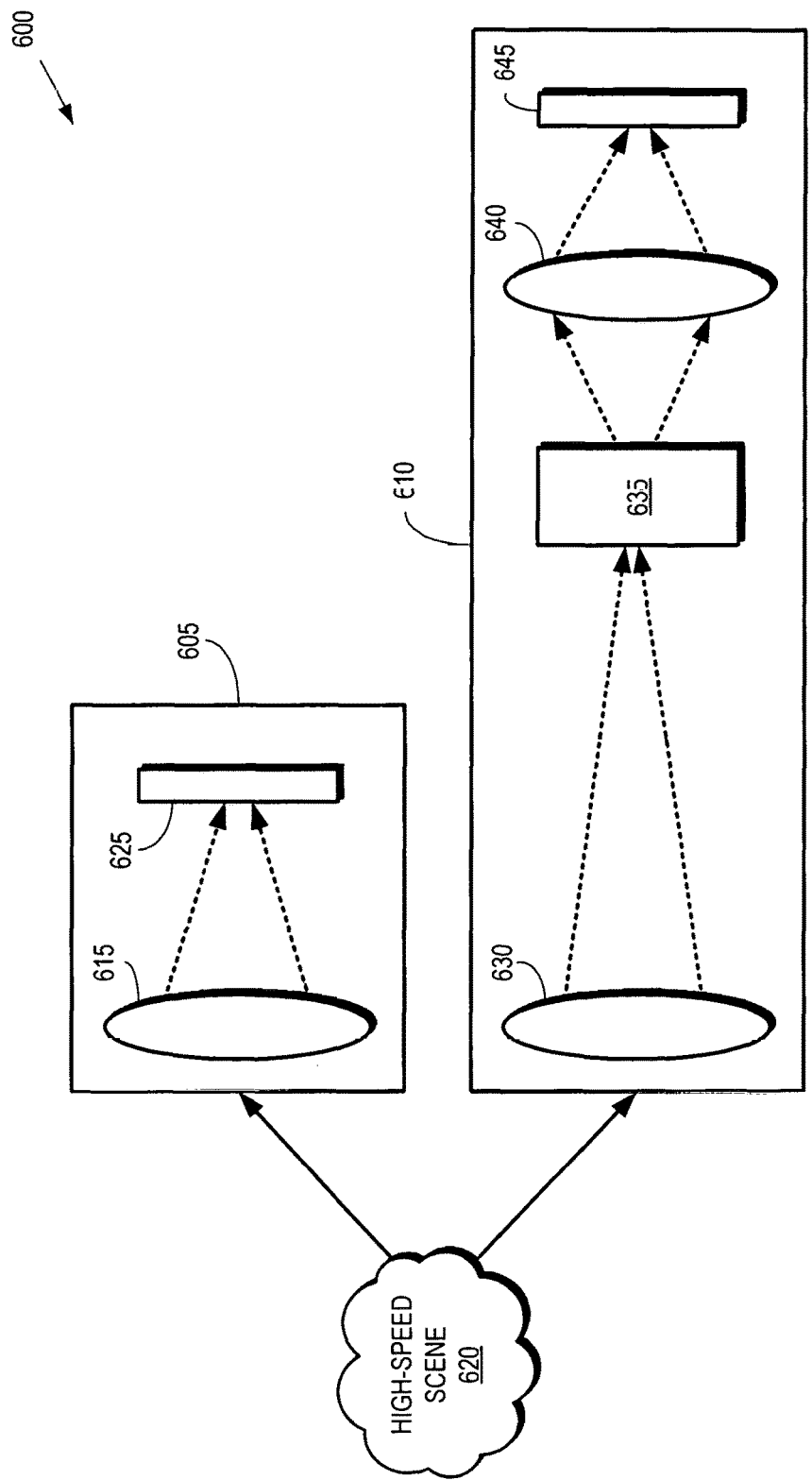
FIG. 6 is a block diagram of an image acquisition system including a first camera for capturing side information and a second camera for capturing coded measurements according to some embodiments.

FIG. 6 is a block diagram of an image acquisition system 600 including a first camera 605 for capturing side information and a second camera 610 for capturing coded measurements according to some embodiments. The first camera 605 and the second camera 610 are used to implement some embodiments of the cameras 110, 115 shown in FIG. 1.

The first camera 605 includes an objective lens 615 that captures light received from a high-speed scene 620. The objective lens 615 focuses the received light onto a first detector 625, which generates images using light captured over an integration time interval. The images captured by the first detector 625 are used as side information.

The second camera 610 includes an objective lens 630 that focuses the received light onto a time-dependent coded aperture 635, which can be implemented as a shifting mask, a rotating mask, a digital mirror device, or other element that is able to modulate the light received from the objective lens 630, e.g. by selectively blocking, transmitting, or reflecting portions of the light received from the objective lens 630. Modulated light from the time-dependent coded aperture 635 is provided to a secondary lens 640, which focuses the light onto a second detector 645. The second detector 645 captures coded images of the high-speed scene 620 over an integration time interval. The images captured by the second detector 645 are coded measurements used in conjunction with the side information generated by the first detector 625 to generate high-speed video frames.

The images can be captured by the first detector 625 and the second detector 645 over the same integration time interval and at the same resolution. However, in some embodiments, the characteristics of the first detector 625 differ from the characteristics of the second detector 645. For example, the first detector 625 can have a lower resolution than the second detector 645, the first detector 625 and the second detector 645 can use different integration time intervals, or the first detector 625 can provide an RGB image, a grayscale image, and infrared image, or an image of the high-speed scene 620 acquired in other bandwidths.

Figure 7:
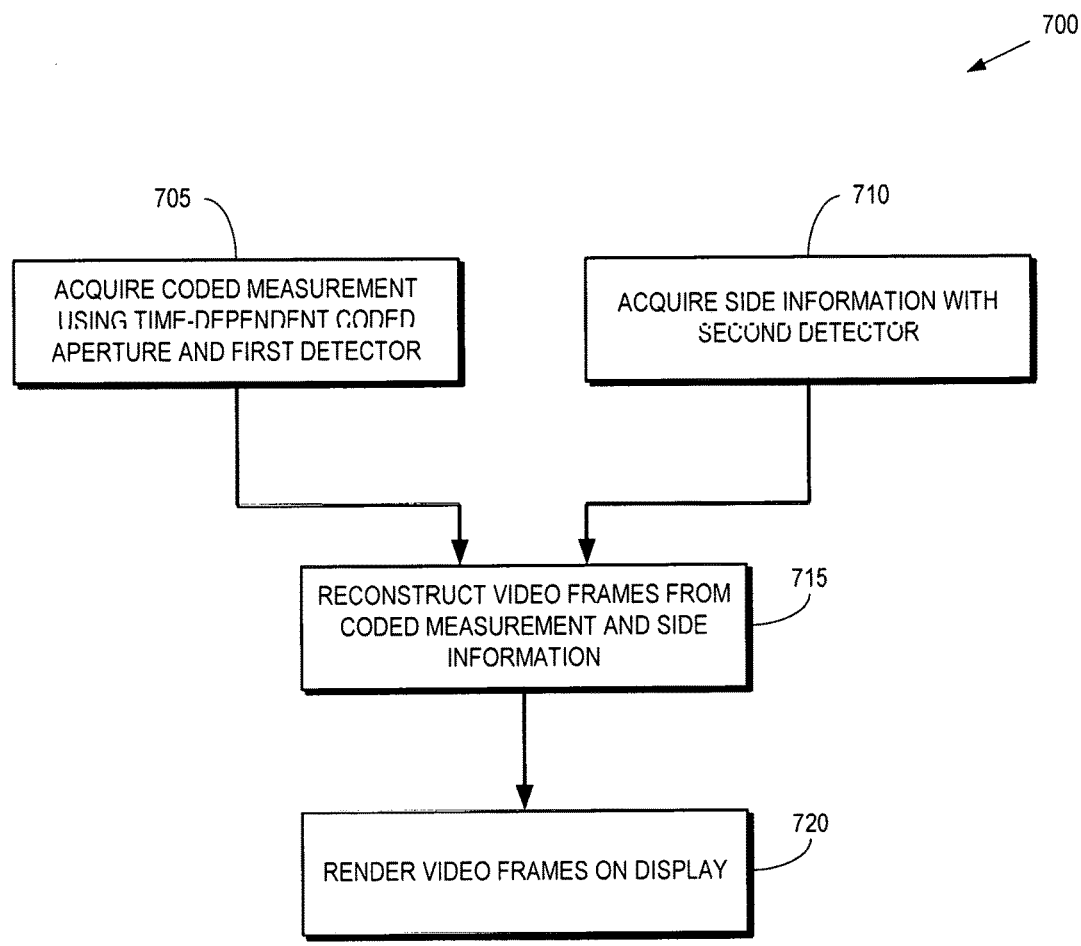
FIG. 7 is a flow diagram of a method of generating high-speed video frames using coded measurements and side information according to some embodiments.

FIG. 7 is a flow diagram of a method 700 of generating high-speed video frames using coded measurements and side information according to some embodiments. The method 700 is implemented in some embodiments of the image acquisition and display system 100 shown in FIG. 1.

At block 705, a coded measurement is acquired using a time-dependent coded aperture and a first detector. The time-dependent coded aperture applies a plurality of masks to selectively provide portions of light received from a scene to the first detector during an integration time interval. The first detector captures the images during the integration time interval and generates a coded measurement using the captured images.

At block 710, side information is acquired by a second detector. For example, the second detector can capture an image of the scene during the integration time interval, but without applying a time-dependent coded aperture to the received light. The second detector acquires the side information concurrently with the first detector requiring the coded measurement. The side information and the coded measurement can be stored for later use or provided directly to a processor for joint reconstruction.

At block 715, the processor reconstructs high-speed video frames from the coded measurement and the side information. As discussed herein, the frame rate of the reconstructed high-speed video frames is higher than the frame rate of the coded measurement or the site information.

At block 720, the high-speed video frames are rendered for presentation on a display. For example, the first detector, the second detector, and the time-dependent coded aperture can be implemented in user equipment that captures the coded measurement and the side information. A processor in the user equipment can reconstruct the high-speed video and render the reconstructed high-speed video for display on a screen implemented in the user equipment. The reconstruction can also be performed using one or more servers implemented in the cloud. Furthermore, if the reconstructed video is not needed immediately, the reconstruction can be performed at a later time on other processors. In this case, the mask and measurements (coded image and side information) are saved and may be transferred to other devices such as other processors, servers, and the like.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the orders in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
    capturing a first image of a scene using light that has been modulated by a time-dependent aperture during an integration time interval for the first image, the first image being a linear combination of a plurality of frames modulated by a plurality of different masks produced by the time-dependent aperture during the integration time interval;
    capturing a second image of the scene concurrently with capturing the first image; and
    reconstructing a plurality of images of the scene based on the first image and the second image.

2. The method of claim 1, wherein the time-dependent aperture comprises at least one of a shifting mask, a rotating mask, a digital mirror device, or another spatial light modulation device.

3. The method of claim 1, wherein capturing the first image comprises capturing the first image using a first camera that includes the time-dependent aperture, and wherein capturing the second image comprises capturing the second image in a second camera.

4. The method of claim 3, wherein capturing the first image and the second image comprises receiving light from the scene at a beam splitter via an objective lens that is shared by the first camera and the second camera, wherein the beam splitter provides a first portion of the received light to the first camera and a second portion of the received light to the second camera.

5. The method of claim 3, wherein capturing the first image comprises capturing light received from the scene via a first objective lens in the first camera, and wherein capturing the second image comprises capturing light received from the scene via a second objective lens in the second camera.

6. The method of claim 1, wherein capturing the first image and the second image comprises capturing the first image and the second image at the same resolution by collecting light over the same integration time interval, the second image being a linear combination of the plurality of frames.

7. The method of claim 1, wherein capturing the first image comprises capturing the first image at a first resolution, and wherein capturing the second image comprises capturing the second image at a second resolution that is different than the first resolution.

8. The method of claim 1, wherein capturing the first image comprises capturing light received over a first integration time interval, and wherein capturing the second image comprises capturing light received over a second integration time interval that differs from, and overlaps with, the first integration time interval, the second image comprising a linear combination of a subset of the plurality of frames.

9. The method of claim 1, wherein capturing the first image comprises capturing a red-green-blue (RGB) image, and wherein capturing the second image comprises capturing at least one of an RGB image, a grayscale image, an infra-red image, or an image acquired in another bandwidth.

10. An apparatus comprising:
    a time-dependent aperture configured to modulate light by applying a plurality of different masks during an integration time interval;
    a first detector configured to capture a first image of a scene during the integration time interval using the modulated light received from the time-dependent aperture, the first image being a linear combination of a plurality of frames modulated by the plurality of different masks during the integration time interval;

a second detector configured to capture a second image of the scene concurrently with the first detector capturing the first image; and a processor configured to reconstruct a plurality of images of the scene based on the first image and the second image.

11. The apparatus of claim 10, wherein the time-dependent aperture comprises at least one of a shifting mask, a rotating mask, a digital mirror device, or another spatial light modulation device.

12. The apparatus of claim 10, further comprising:

an objective lens configured to receive light from the scene; and a beam splitter configured to receive light from the objective lens and provide a first portion of the light to the time-dependent aperture and a second portion of the light to the second detector.

13. The apparatus of claim 10, further comprising:

a first camera comprising the time-dependent aperture and the first detector; and a second camera that does not include any time-dependent apertures to modulate light received from the scene.

14. The apparatus of claim 13, wherein the first camera comprises a first objective lens configured to receive light from the scene and to provide light to the time-dependent aperture, and wherein the second camera comprises a second objective lens configured to receive light from the scene and to provide light to the second detector.

15. The apparatus of claim 10, wherein the first detector and the second detector are configured to capture the first image and the second image at the same resolution by collecting light over the same integration time interval, the second image being a linear combination of the plurality of frames.

16. The apparatus of claim 10, wherein the first detector is configured to capture the first image at a first resolution, and wherein the second detector is configured to capture the second image at a second resolution that is different than the first resolution.

17. The apparatus of claim 10, wherein the first detector is configured to capture light received over a first integration time interval, and wherein the second detector is configured to capture light received over a second integration time interval that differs from, and overlaps with, the first integration time interval, the second image comprising a linear combination of a subset of the plurality of frames.

18. The apparatus of claim 10, wherein the first detector is configured to capture an RGB image, and wherein the second detector is configured to capture at least one of an RGB image, a grayscale image, an infrared image, or an image acquired at another bandwidth.

19. An apparatus comprising:

a memory element configured to store information representative of a first image captured by a first detector using light from a scene that has been modulated by a time-dependent aperture during an integration time interval for the first image and a second image of the scene captured by a second detector concurrently with the first detector capturing the first image, the first image being a linear combination of a plurality of frames modulated by a plurality of different masks during the integration time interval; and a processor configured to reconstruct a plurality of images of the scene based on the first image and the second image.

20. The apparatus of claim 19, further comprising:

a time-dependent aperture configured to generate a plurality of different masks to modulate light during the integration time interval, and wherein the first detector is configured to capture the first image during the integration time interval using the modulated light.

* * * * *